(12) United States Patent
Cheng et al.

(10) Patent No.: US 10,515,980 B2
(45) Date of Patent: Dec. 24, 2019

(54) FLASH MEMORY STRUCTURE AND METHOD OF MANUFACTURING THE SAME

(71) Applicant: National Taiwan Normal University, Taipei (TW)

(72) Inventors: Chun-Hu Cheng, Tainan (TW); Chun-Yen Chang, Zhubei (TW); Yu-Chien Chiu, Kaohsiung (TW)

(73) Assignee: National Taiwan Normal University, Taipei (TW)

( * ) Notice: Subject to any disclaimer, the term of this patent is extended or adjusted under 35 U.S.C. 154(b) by 0 days.

(21) Appl. No.: 15/854,947

(22) Filed: Dec. 27, 2017

(65) Prior Publication Data

US 2018/0182769 A1 Jun. 28, 2018

(30) Foreign Application Priority Data

Dec. 27, 2016 (TW) .............................. 105143278 A (51) Int. Cl.

| | |
|---|---|
| *H01L 27/1159* | (2017.01) |
| *H01L 29/78* | (2006.01) |
| *H01L 27/11587* | (2017.01) |
| *H01L 27/11597* | (2017.01) |
| *H01L 29/792* | (2006.01) |

(Continued)

(52) U.S. Cl.
CPC ........ *H01L 27/1159* (2013.01); *G11C 11/223* (2013.01); *G11C 16/0483* (2013.01); *H01L 27/1157* (2013.01); *H01L 27/11565* (2013.01); *H01L 27/11578* (2013.01);

(Continued)

(58) Field of Classification Search
CPC .......... H01L 27/1159; H01L 29/78391; H01L 27/11587; H01L 27/11597; H01L 29/792; H01L 27/11565; H01L 27/1157; H01L 27/11578; H01L 29/66666; H01L 27/11517–1156; H01L 29/42324–42336; H01L 2924/1438; H01L 29/788–7889; G11C 16/0483; G11C 11/223
See application file for complete search history.

(56) References Cited

U.S. PATENT DOCUMENTS

| | | | |
|---|---|---|---|
| 2017/0062456 A1* | 3/2017 | Sugino | ............. H01L 27/11582 |
| 2017/0104000 A1* | 4/2017 | Park | ................. H01L 27/11582 |

(Continued)

*Primary Examiner* — Shahed Ahmed
(74) *Attorney, Agent, or Firm* — Juan Carlos A. Marquez; Marquez IP Law Office, PLLC (57) ABSTRACT

A flash memory structure and a method of making the same are provided. The flash memory structure comprises a substrate, a source, a drain, a tunnel isolation layer, a ferroelectric-charge-trapping layer, at least one blocking isolation layer and at least one gate. The substrate is made of a semiconductive material. The source is formed on the substrate. The drain is formed on the substrate and spaced apart from the source. The tunnel isolation layer is formed on the substrate. The ferroelectric-charge-trapping layer is formed on the tunnel isolation layer and contains a charge-trapping layer and a ferroelectric negative-capacitance effect layer. The at least one blocking isolation layer is formed on the ferroelectric-charge-trapping layer. The at least one gate is formed on the blocking isolation layer. The ferroelectric negative-capacitance effect layer is made of a material with the ferroelectric negative-capacitance effect.

13 Claims, 9 Drawing Sheets

(51) Int. Cl.
   *G11C 16/04*      (2006.01)
   *H01L 27/11565*   (2017.01)
   *H01L 27/1157*    (2017.01)
   *H01L 27/11578*   (2017.01)
   *G11C 11/22*      (2006.01)

(52) U.S. Cl.
   CPC .. *H01L 27/11587* (2013.01); *H01L 27/11597* (2013.01); *H01L 29/78391* (2014.09); *H01L 29/792* (2013.01)

(56) References Cited

U.S. PATENT DOCUMENTS

2018/0122959 A1* 5/2018 Calka ................. C23C 16/34
2018/0366564 A1* 12/2018 Levy .................. B82Y 10/00

* cited by examiner

FLASH MEMORY STRUCTURE AND METHOD OF MANUFACTURING THE SAME

FIELD OF THE INVENTION

The present invention relates to a memory structure and a method of manufacturing the same, and more particularly to a flash memory structure and a method of manufacturing the same.

BACKGROUND OF THE INVENTION

Figure 1:
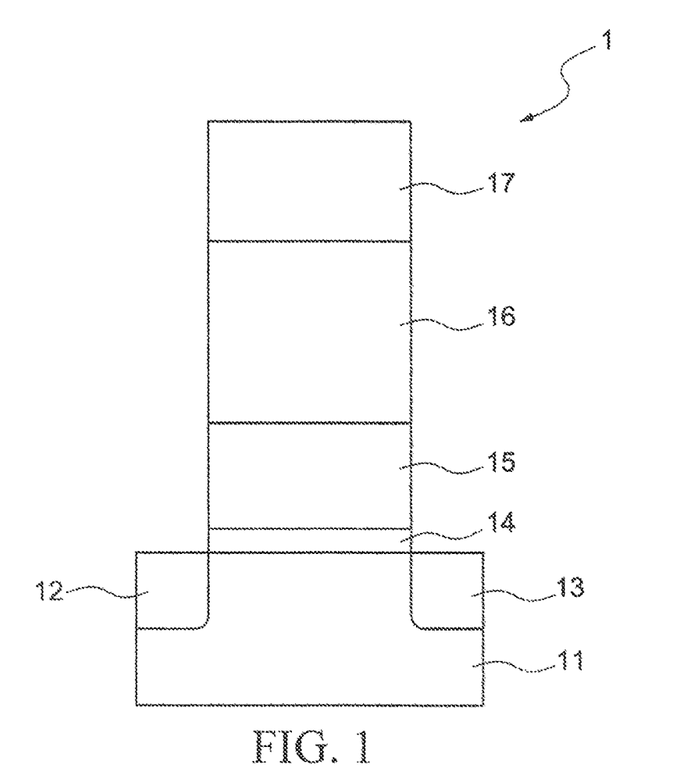
FIG. 1 is a schematic diagram of a conventional flash memory structure.

Referring to FIG. 1, a conventional flash memory structure 1 includes a substrate 11, a source 12, a drain 13, a tunnel isolation layer 14, a charge-trapping layer 15, a blocking isolation layer 16 and a gate 17. The source 12 is formed on the substrate 11. The drain 13 is formed on the substrate 11 and spaced apart from the source 12. The tunnel isolation layer 14 is formed on the substrate 11. The charge-trapping layer 15 is formed on the tunnel isolation layer 14. The blocking isolation layer 16 is formed on the charge-trapping layer 15. The gate 17 is formed on the blocking isolation layer 16.

Figure 2:
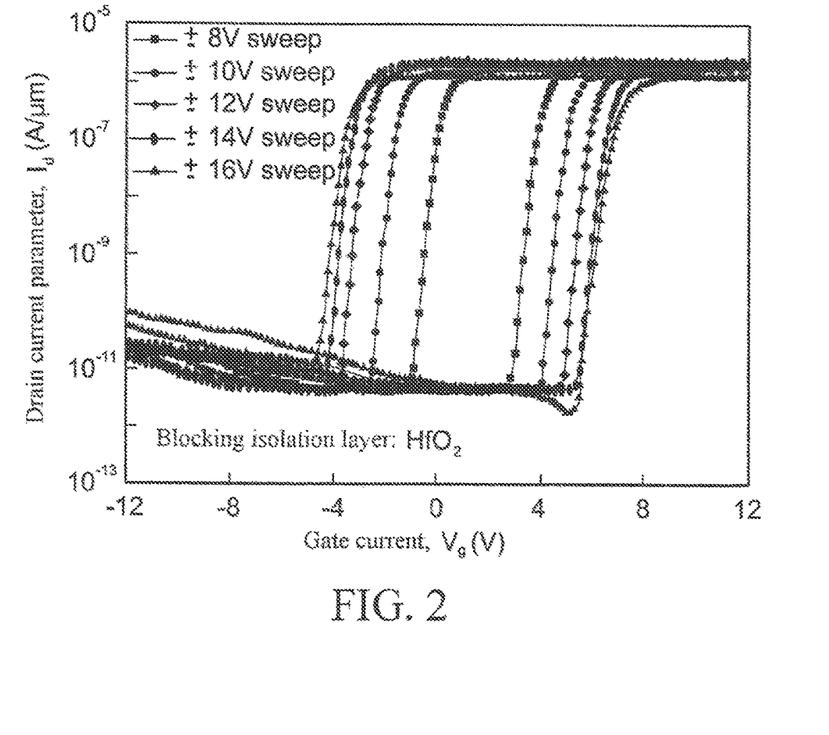
FIG. 2 is a read-write data map of a gate voltage vs. a drain current parameter of the conventional flash memory structure.

Referring to FIG. 2, it is a read-write data map of a gate voltage $V_G$ (unit: V) vs. a drain current parameter $I_D$ (unit: A/um) when the conventional flash memory structure 1 performs reading and writing during different gate voltage sweeps. As shown in FIG. 2, the conventional flash memory structure 1 has a large writing/erase voltage (greater than 15 V) and the minimum value of its Subthreshold Swing (S.S.) is 60 mV/dec. As a general high dielectric permittivity material, e.g., $HfO_2$, is used as the blocking isolation layer 16, the conventional flash memory structure 1 has a large leakage current and a poor S.S. and requires a large voltage to open a memory window.

Figure 3:
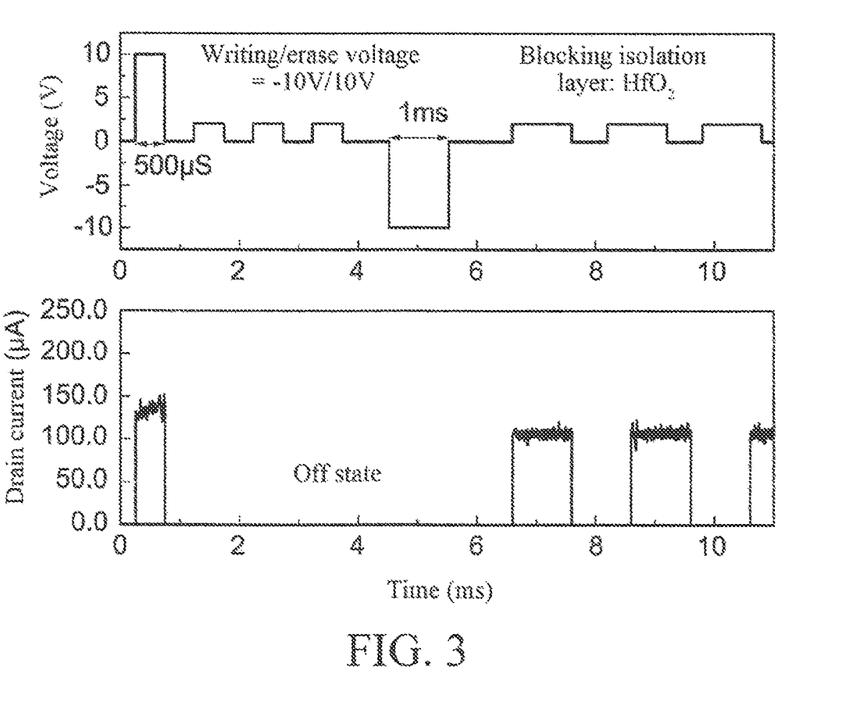
FIG. 3 is a measuring data map of time vs. a gate operating voltage and a drain current of the conventional flash memory structure.

FIG. 3 is a measuring data map of time (unit: ms) vs. a gate operating voltage (unit: V) and a drain current (unit: μA) of the conventional flash memory structure 1. As shown in FIG. 3, the speed of the reading-writing operation of the conventional flash memory structure 1 is slow, which is about 100 μs to 1 ms, because a general high dielectric permittivity material, e.g., $HfO_2$, is used as the blocking isolation layer 16 (FIG. 1).

The conventional flash memory structure 1 has a slow operating speed (about 100 μs to 1 ms), a large writing/erase voltage (e.g., greater than 15 V) and poor operation durability (about $10^5$ cycles). However, the basic transistor physical phenomenon of the conventional flash memory structure 1 makes the minimum value of the S.S. be 60 mV/dec, and the operating voltage and switch power consumption cannot further be reduced. In response to a future high-density memory technical demand, development of the flash memory with a fast operating speed and low power consumption is necessary.

SUMMARY OF THE INVENTION

An objective of the present invention is to provide a flash memory structure and a method of manufacturing the same, to make the flash memory structure of the present invention have characteristics of reduced writing and erase voltages of the memory and increased operating speed of elements.

The flash memory structure of one embodiment includes a substrate, a source, a drain, a tunnel isolation layer, a ferroelectric-charge-trapping layer, at least one blocking isolation layer and at least one gate. The substrate is made of a semiconductive material. The source is formed on the substrate. The drain is formed on the substrate and spaced apart from the source. The tunnel isolation layer is formed on the substrate. The ferroelectric-charge-trapping layer is formed on the tunnel isolation layer and contains a charge-trapping layer and a ferroelectric negative-capacitance effect layer. The at least one blocking isolation layer is formed on the ferroelectric-charge-trapping layer. The at least one gate is formed on the blocking isolation layer. The ferroelectric negative-capacitance effect layer is made of a material with the ferroelectric negative-capacitance effect.

A method of making a flash memory structure of one embodiment includes the following steps: providing a substrate made of a semiconductive material; forming a source on the substrate; forming a drain spaced apart from the source on the substrate; forming a tunnel isolation layer on the substrate; forming a ferroelectric-charge-trapping layer on the tunnel isolation layer, the ferroelectric-charge-trapping layer including a charge-trapping layer and a ferroelectric negative-capacitance effect layer; forming at least one blocking isolation layer on the ferroelectric-charge-trapping layer; and forming at least one gate on the blocking isolation layer. The ferroelectric negative-capacitance effect layer is made of a material with the ferroelectric negative-capacitance effect.

The present invention uses a ferroelectric negative-capacitance effect layer to enable the flash memory structure of the present invention to reduce the writing and erase voltages of the memory and increase the operating speed of elements.

DETAILED DESCRIPTION OF THE INVENTION

Figure 4:
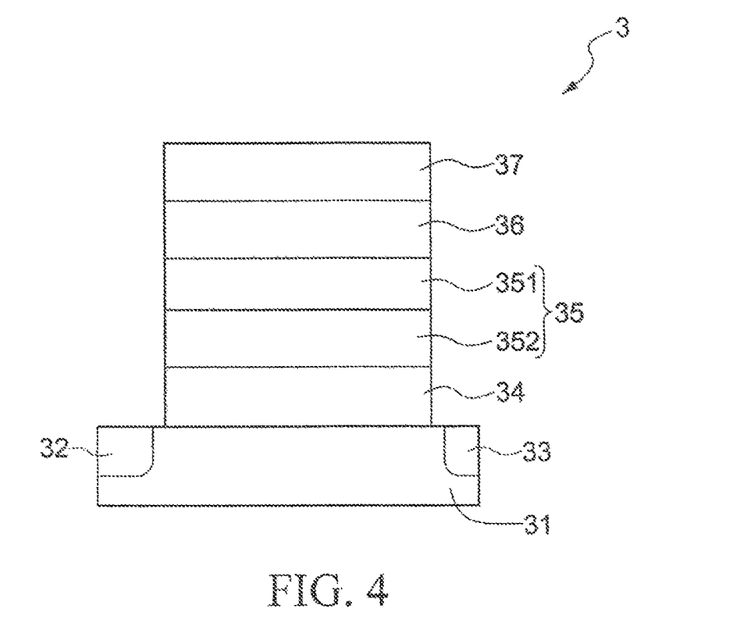
FIG. 4 is a schematic view of a 2D flash memory structure of one embodiment.

Referring to FIG. 4, the flash memory structure 3 of one embodiment includes a substrate 31, a source 32, a drain 33, a tunnel isolation layer 34, a ferroelectric-charge-trapping layer 35, at least one blocking isolation layer 36 and at least one gate 37. The substrate 31 is made of a semiconductive material. The source 32 is formed on the substrate 31. The drain 33 is formed on the substrate 31 and spaced apart from the source 32. The tunnel isolation layer 34 is formed on the substrate 31. The ferroelectric-charge-trapping layer 35 is formed on the tunnel isolation layer 34 and contains a charge-trapping layer 351 and a ferroelectric negative-capacitance effect layer 352. The at least one blocking isolation layer 36 is formed on the ferroelectric-charge-trapping layer 35. The at least one gate 37 is formed on the blocking isolation layer 36. The ferroelectric negative-capacitance effect layer 352 is made of a material with the ferroelectric negative-capacitance effect. To improve the isolation performance, the blocking isolation layer 36 may be single-layered, double-layered or multi-layered. An embodiment shown in FIG. 4 is a 2D flash memory structure 3.

The positions of forming the charge-trapping layer 351 and the ferroelectric negative-capacitance effect layer 352 of the ferroelectric-charge-trapping layer 35 are interchangeable. The charge-trapping layer 351 and the ferroelectric negative-capacitance effect layer 352 of the ferroelectric-charge-trapping layer 35 may be sequentially formed on the tunnel isolation layer 34, or in the embodiment as shown in FIG. 4, the ferroelectric negative-capacitance effect layer 352 and the charge-trapping layer 351 of the ferroelectric-charge-trapping layer 35 are sequentially formed on the tunnel isolation layer 34.

Figure 5:
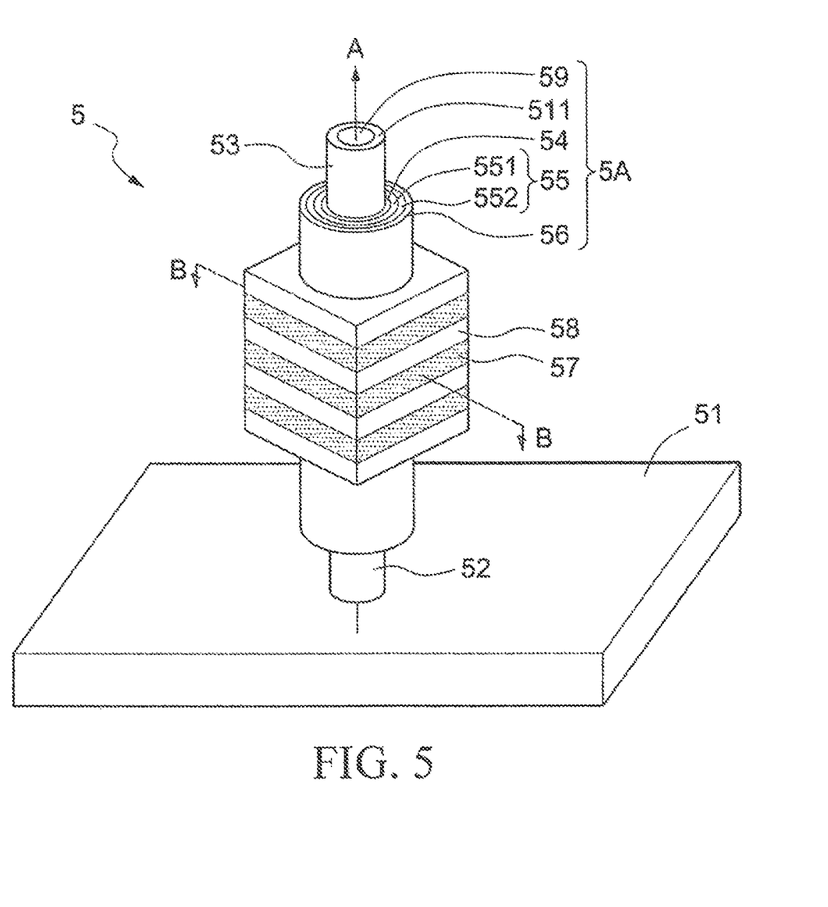
FIG. 5 is a schematic three-dimensional view of a 3D flash memory structure of one embodiment.
Figure 6:
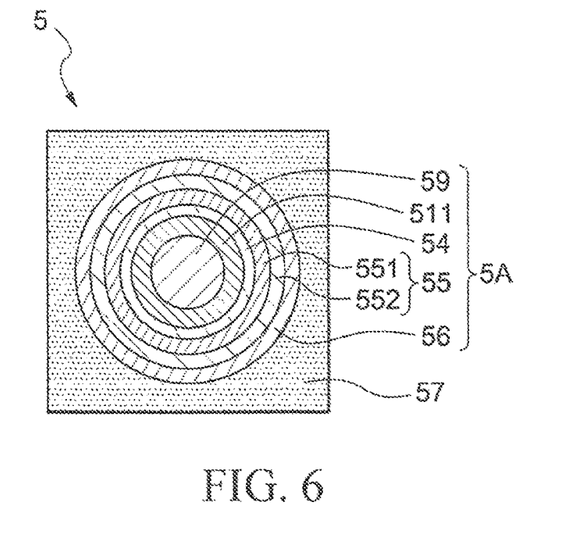
FIG. 6 is a schematic sectional view of the 3D flash memory structure of one embodiment along the B-B sectional line.

A 3D flash memory structure 5 according to another embodiment is as shown in FIG. 5 and FIG. 6. Referring to FIG. 5 at first, a 3D flash memory structure 5 is similar to the 2D flash memory structure 3, but forms a three-dimensional structure. For example, a stacked columnar structure as shown in FIG. 5 includes a substrate 51, a source 52, a drain 53, a tunnel isolation layer 54, a ferroelectric-charge-trapping layer 55, at least one blocking isolation layer 56 and at least one gate 57. The substrate 51 is made of a semiconductive material. The stacked columnar structure is as follows. The source 52 is formed on the substrate 51. The drain 53 is formed on the substrate 51 and spaced apart from the source 52. The columnar tunnel isolation layer 54 is formed on the substrate 51. The ferroelectric-charge-trapping layer 55 is formed on and coats the tunnel isolation layer 54, and the ferroelectric-charge-trapping layer 55 includes a charge-trapping layer 551 and a ferroelectric negative-capacitance effect layer 552. The at least one blocking isolation layer 56 coats and is formed on the ferroelectric-charge-trapping layer 55. The at least one gate 57 is formed on the blocking isolation layer 56. The ferroelectric negative-capacitance effect layer 552 is made of a material with the ferroelectric negative-capacitance effect. To improve the isolation performance, the blocking isolation layer 56 may be single-layered, double-layered or multi-layered.

As shown in FIG. 5, the 3D flash memory structure 5 is different from the 2D flash memory structure 3 in that the substrate 51 extends in an axial direction A to form a columnar tunnel portion 511, the columnar tunnel portion 511 is formed between the source 52 and the drain 53, and the tunnel isolation layer 54 is formed on an outside of the columnar tunnel portion 511 and surrounds the columnar tunnel portion 511. As shown in FIG. 5, the source 52 and the drain 53 may be formed on two ends of the columnar tunnel portion 511, while the tunnel isolation layer 54 is formed on the columnar tunnel portion 511 between the source 52 and the drain 53. In addition, the ferroelectric-charge-trapping layer 55 surrounds and is formed on an outside of the tunnel isolation layer 54, the blocking isolation layer 56 surrounds and is formed on an outside of the ferroelectric-charge-trapping layer 55, and the at least one gate 57 surrounds and is formed on an outside of the blocking isolation layer 56.

As shown in FIG. 5 and FIG. 6, preferably, the tunnel isolation layer 54 surrounds the columnar tunnel portion 54 and is annular, the ferroelectric-charge-trapping layer 56 surrounds the tunnel isolation layer 54 and is annular, and the blocking isolation layer 54 surrounds the ferroelectric-charge-trapping layer 55 and is annular. The date 57 is one or more plate-shaped structures formed on an outside of the ferroelectric-charge-trapping layer 55. As shown in FIG. 5, the columnar tunnel portion 511, the tunnel isolation layer 54, the ferroelectric-charge-trapping layer 55, and the blocking isolation layer 56 form a columnar structure 5A. The columnar structure 5A extends through the at least one gate 57 in the axial direction A of the columnar tunnel portion 511.

Preferably, as shown in FIG. 5, the 3D flash memory structure 5 has multiple storage positions, and thus includes a plurality of plate-shaped gates 57. The gates 57 are spaced apart from each other, and the columnar structure 5A extends through the gates 57 in the axial direction A of the columnar tunnel portion 511. To isolate the gates 57, the 3D flash memory structure 5 further includes a plurality of plate-shaped spacing isolation layers 58. The spacing insulating layers 58 are formed between the gates 57 in an intersecting manner so that the gates 57 are mutually insulated.

In an embodiment, the 3D flash memory structure 5 may also include an insulating columnar core 59. In this embodiment, the columnar tunnel portion 511 is formed on an outside of the insulating columnar core 59 and surrounds the insulating column core 59, as shown in FIG. 5 and FIG. 6.

The positions of forming the charge-trapping layer 551 and the ferroelectric negative-capacitance effect layer 552 of the ferroelectric-charge-trapping layer 55 of the 3D flash memory structure 5 are also interchangeable. The charge-trapping layer 551 and the ferroelectric negative-capacitance effect layer 552 of the ferroelectric-charge-trapping layer 55 may be, as in a stacked order of an embodiment shown in FIG. 5 and FIG. 6, sequentially formed on the tunnel isolation layer 54, or the ferroelectric negative-capacitance effect layer 552 and the charge-trapping layer 551 of the ferroelectric-charge-trapping layer 55 are sequentially formed on the tunnel isolation layer 54 in an order from inside to outside.

Referring to FIG. 4, a method of making a 2D flash memory structure 3 of one embodiment includes the following steps: providing a substrate 31 made of a semiconductive material; forming a source 32 on the substrate 31; forming a drain 33 spaced apart from the source 32 on the substrate 31; forming a tunnel isolation layer 34 on the substrate 31; forming a ferroelectric-charge-trapping layer 35 on the tunnel isolation layer 34, the ferroelectric-charge-trapping layer 35 including a charge-trapping layer 351 and a ferroelectric negative-capacitance effect layer 352; forming at least one blocking isolation layer 36 on the ferroelectric-charge-trapping layer 35; and forming at least one gate 37 on the blocking isolation layer 36. The ferroelectric negative-capacitance effect layer 352 is made of a material with the ferroelectric negative-capacitance effect.

As stated above, the positions of forming the charge-trapping layer 351 and the ferroelectric negative-capacitance effect layer 352 of the ferroelectric-charge-trapping layer 35 are interchangeable. The charge-trapping layer 351 and the ferroelectric negative-capacitance effect layer 352 of the ferroelectric-charge-trapping layer 35 may be, in an order as shown in FIG. 4, formed on the tunnel isolation layer 34, or the order in which they are stacked is exchanged.

Referring to FIG. 5 and FIG. 6, the method of making a 3D flash memory structure 5 of one embodiment is similar to the method of making a 2D flash memory structure 3, and includes the following steps: providing a substrate 51 made of a semiconductive material, wherein the step of providing a substrate 51 includes forming a columnar tunnel portion 511 extending along an axial direction A; forming a source 52 on the substrate 51; forming a drain 53 spaced apart from the source 52 on the substrate 51, wherein the columnar tunnel portion 511 is formed between the source 52 and the drain 53; forming a tunnel isolation layer 54 on the substrate 51, wherein the tunnel isolation layer 54 is formed on an outside of the columnar tunnel portion 511 and surrounds the columnar tunnel portion 511; forming a ferroelectric-charge-trapping layer 55 on the tunnel isolation layer 54, the ferroelectric-charge-trapping layer 55 including a charge-trapping layer 551 and a ferroelectric negative-capacitance effect layer 552; forming at least one blocking isolation layer 56 on the ferroelectric-charge-trapping layer 55; and forming at least one gate 57 on the blocking isolation layer 56. The ferroelectric negative-capacitance effect layer 552 is made of a material with the ferroelectric negative-capacitance effect.

As shown in FIG. 5, the source 52 and the drain 53 may be formed on two ends of the columnar tunnel portion 511, while the tunnel isolation layer 54 is formed on the columnar tunnel portion 51 between the source 52 and the drain 53. As shown in FIG. 5, owing to the 3D structure of the flash memory structure 5, the ferroelectric-charge-trapping layer 55 is formed on an outside of the tunnel isolation layer 54, the blocking isolation layer 56 is formed on an outside of the ferroelectric-charge-trapping layer 55, and the at least one gate 57 is formed on an outside of the blocking isolation layer 56. Preferably, as shown in FIG. 5 and FIG. 6, the tunnel isolation layer 54 surrounds the columnar tunnel portion 511 and is annular, the ferroelectric-charge-trapping layer 55 surrounds the tunnel isolation layer 54 and is annular, and the blocking isolation layer 56 surrounds the ferroelectric-charge-trapping layer 55 and is annular. The at least one gate 57 is plate-shaped. The columnar tunnel portion 511, the tunnel isolation layer 54, the ferroelectric-charge-trapping layer 55 and the blocking isolation layer 56 form a columnar structure 5A. The columnar structure 5A extends through the at least one gate 57 in the axial direction A of the columnar tunnel portion 511. Preferably, the 3D flash memory structure 5 has multiple storage positions, and thus the method of making the 3D flash memory structure 5 includes forming a plurality of plate-shaped gates 57, as shown in FIG. 5. The gates 57 are spaced apart from each other, and the columnar structure 5A extends through the gates 57 in the axial direction A of the columnar tunnel portion 511. To make the gates 57 insulated from each other, the method of making the 3D flash memory structure 5 further includes forming a plurality of plate-shaped spacing insulation layers 58. The spacing insulating layers 58 are formed between the gates 57 so that the gates 57 are mutually insulated.

In an embodiment, the method of making the 3D flash memory structure 5 further includes forming an insulating columnar core 59. The columnar tunnel portion 511 is formed on an outside of the insulating columnar core 59 and surrounds the insulating column core 59.

As stated above, the positions of forming the charge-trapping layer 551 and the ferroelectric negative-capacitance effect layer 552 of the ferroelectric-charge-trapping layer 55 of the 3D flash memory structure 5 are interchangeable. That is, the charge-trapping layer 551 and the ferroelectric negative-capacitance effect layer 552 of the ferroelectric-charge-trapping layer 55 may be, in an embodiment as shown in FIG. 5 and FIG. 6, sequentially formed on the tunnel isolation layer 54, or the forming order of the ferroelectric negative-capacitance effect layer 552 and the charge-trapping layer 551 of the ferroelectric-charge-trapping layer 55 is exchanged.

The charge-trapping layer 351, 551 may be made of a conductive material, a semiconductive material, a dielectric material, or a two-dimensional material. The dielectric material used in the charge-trapping layer 351, 551 may be a high dielectric material of zirconium silicon oxide, silicon nitride, tantalum oxide, silicon oxynitride, barium strontium titanate, silicon carbide, silicon oxycarbide, hafnium oxide, hafnium silicon oxide, hafnium zirconium oxide, hafnium silicon oxynitride, hafnium oxynitride, zirconium oxide, titanium oxide, cerium oxide, lanthanum oxide, lanthanum aluminum oxide, or aluminum oxide. The two-dimensional material used in the charge-trapping layer 35, 551 may be graphene, $MoS_2$, $WS_2$, $MoSe_2$, $WSe_2$, SnO, or black phosphorus. The graphene may be porous graphene, monolayer graphene or multilayer graphene.

The material with the ferroelectric negative-capacitance effect used in the ferroelectric negative-capacitance effect layer 352, 552 may be selected from the group consisting of hafnium zirconium oxide, hafnium silicon oxide, lead zirconate titanate, barium strontium titanate, strontium bismuth tantalite, lead lanthanum zirconate titanate, hafnium aluminum oxide, hafnium yttrium oxide, or is with hafnium oxide ($HfO_2$) as a matrix and doped with doping materials selected from the group consisting of zirconate (Zr), aluminum (Al), silicon (Si), yttrium (Y), gadolinium (Gd), strontium (Sr), lanthanum (La) and combinations thereof. In the situation with hafnium oxide ($HfO_2$) as a matrix and doped with doping materials, the material with the ferroelectric negative-capacitance effect includes zirconium (Zr) of 15-85 mol %, aluminum (Al) of 2-15 mol %, silicon (Si) of 2-10 mol %, yttrium (Y) of 2-15 mol %, gadolinium (Gd) of 2-15 mol %, strontium (Sr) of 2-15 mol %, or lanthanum (La) of 2-15 mol %.

The substrate 31, 51 may use mono-Si, Poly-Si or other suitable materials. The tunnel isolation layer 54 may use $SiO_2$ or other suitable materials. The gate 37, 57 may use TaN or other suitable materials. The at least one blocking isolation layer 36, 56 may be made of a material selected from the group consisting of $Al_2O_3$ and $SiO_2$, or other suitable materials. As stated above, the at least one blocking isolation layer 36, 56 may be single-layered, double-layered or multi-layered, and thus the at least one blocking isolation layer 36, 56 may be a $SiO_2$ monolayer, a $Al_2O_3$ monolayer, a $SiO_2/Al_2O_3$ double-layer, a $Al_2O_3/SiO_2$ double-layer or a combination of other materials and layers. The insulating columnar core 59 may use $SiO_2$ or other suitable materials.

According to different forming positions of the charge-strapping layer 351, 551 and the ferroelectric negative-capacitance effect layer 352, 552 of the ferroelectric-charge-trapping layer 35, 55 of the flash memory structure 3 or 5, the flash memory structures 3, 5 are respectively applicable to a non-volatile flash memory or a ferroelectric memory. An example is as follows. If the charge-strapping layer 351, 551 and the ferroelectric negative-capacitance effect layer 352, 552 are sequentially formed on the tunnel isolation layer 34, 54, and when the charge-strapping layer 351, 551 is attached on the tunnel isolation layer 34, 54, compared with the traditional structure, the flash memory structure 3, 5, in addition to having a fast operating speed and durability, retentivity may still be improved, which is a non-volatile flash memory, i.e., a NAND flash memory. If the order in which the ferroelectric negative-capacitance effect layer 352, 552 and the charge-strapping layer 351, 551 are formed on the tunnel isolation layer 34, 54 is reversed, when the ferroelectric negative-capacitance effect layer 352, 552 is attached on the tunnel isolation layer 34, 54, the flash memory structure 3, 5 is a ferroelectric memory.

Figure 7:
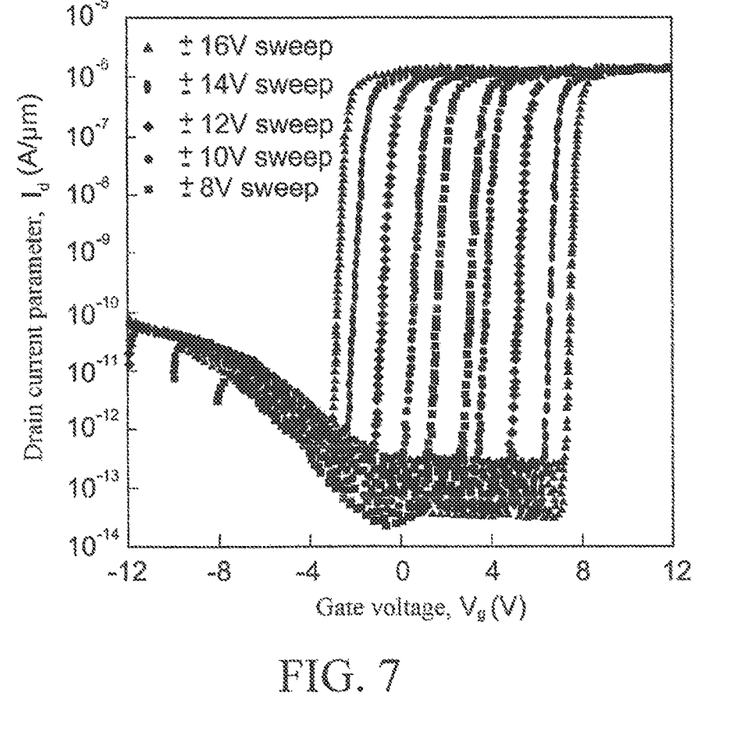
FIG. 7 is a read-write data map of a gate voltage vs. a drain current parameter of the 2D flash memory structure of one embodiment.

Referring to FIG. 7, it is a read-write data map of a gate voltage $V_G$ (unit: V) vs. a drain current parameter $I_D$ (unit: A/um) when the 2D flash memory structure 3 of one embodiment sweeps for reading and writing in different gates and voltages. As shown in FIG. 7, through experiments, under an operation at a read-write voltage of 8 V to 16 V, the maximum memory window of the 2D flash memory structure 3 of one embodiment is up to 8 V (in the case of a read-write voltage of 16 V), and it may be obtained from the slope of the curve in FIG. 7 that the 2D flash memory structure 3 of one embodiment effectively improves the Subthreshold Swing (S.S.) of the memory transistor element.

Figure 8:
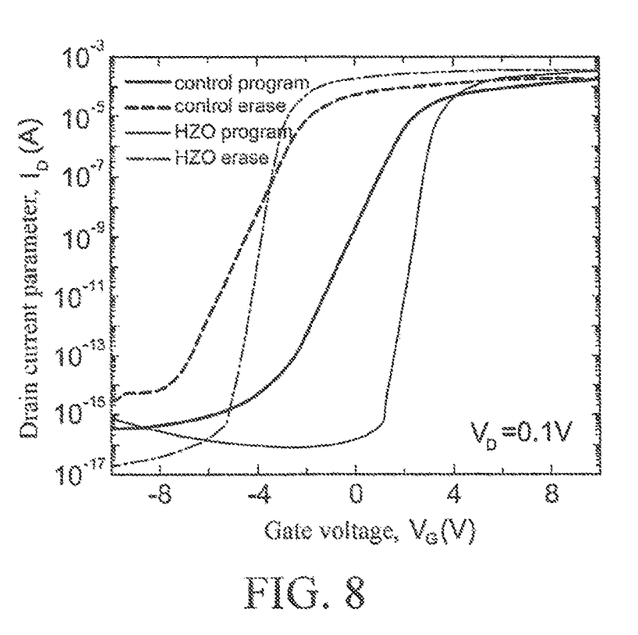
FIG. 8 is a writing-erase data map of a gate voltage vs. a drain current of the 3D flash memory structure of one embodiment.

Referring to FIG. 8, it is a writing-erase data map of a gate voltage $V_G$ (unit: V) vs. a drain current $I_D$ (unit: A) generated through simulation of the 3D flash memory structure 5 of one embodiment and the conventional 3D flash memory structure as a control group. The gate voltage (VD) is 01 V, the "control program" curve represents a curve when the conventional 3D flash memory structure as the control group writes, the "control erase" curve represents a curve when the conventional 3D flash memory structure as the control group erases, the "HZO program" curve represents a curve when the 3D flash memory structure 5 of one embodiment uses HfZrO as the material with the ferroelectric negative-capacitance effect used in the ferroelectric negative-capacitance effect layer 352, 552 for data writing, and the "HZO erase" curve represents a curve when the 3D flash memory structure 5 of one embodiment uses HfZrO as the material with the ferroelectric negative-capacitance effect used in the ferroelectric negative-capacitance effect layer 352, 552 for data erasing. It can be known from FIG. 8 that the 3D flash memory structure 5 of one embodiment may effectively improve the Subthreshold Swing (S.S.), reduce the memory operating gate voltage $V_G$, and increase the gate current $I_D$.

Figure 9:
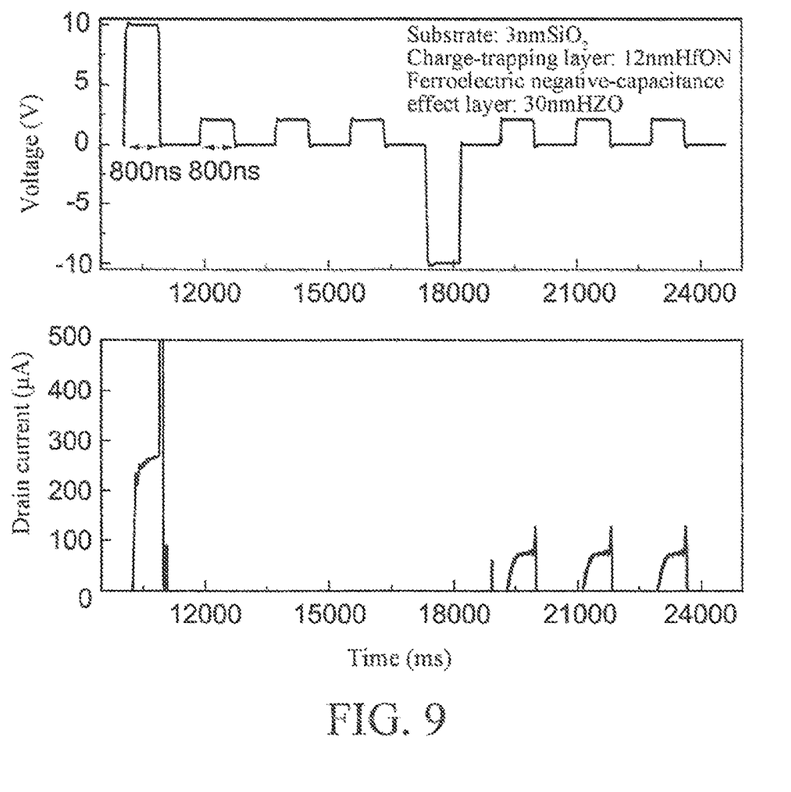
FIG. 9 is a measuring data map of time vs. a gate operating voltage and a drain current of the 2D flash memory structure of one embodiment.

FIG. 9 is a measuring data map of time (unit: ns) vs. a gate operating voltage (unit: V) and a drain current (unit: µA) of the 2D flash memory structure 3. FIG. 9 indicates the materials and thicknesses used respectively by the substrate 31, the charge-trapping layer 351 and the ferroelectric negative-capacitance effect layer 352 used by the 2D flash memory structure 3 for measuring. As shown in FIG. 9, the read-write operating speed of the flash memory structure 3 of one embodiment is increased to a level of hundreds of nanoseconds from the level of microseconds of the conventional flash memory structure 1, which is faster than the operating speed of the conventional flash memory structure 1. As shown in FIG. 9, the read-write operating speed of the flash memory structure 3 of one embodiment is increased to a level below 800 ns.

In addition, it may be obtained from further testing of the flash memory structures 3, 5, the flash memory structures 3, 5 with the ferroelectric negative-capacitance effect layers 352, 552 may preserve data at 85° C., and have good durability (the read-write erase is more than $10^6$ times). Therefore, the present invention may effectively improve the problems faced by miniaturization of the existing flash memory such as a too large operating voltage, a too slow read-write operating speed, and deteriorated durability. The improvement mechanism of the flash memory structure 3, 5 of one embodiment results from high-speed ferroelectric electric dipoles, and improves the Fowler-Nordheim (F-N) tunneling transmission mechanism of the flash memory.

In summary, the present invention utilizes the ferroelectric negative-capacitance effect layers 352, 552 to make the flash memory structure 3, 5 of the present invention effectively improve the Sub Swing (S.S.) of transistor elements, reduce an off current ($I_{off}$), and have characteristics such as reducing writing and erase voltages of the memory and increasing operating speeds of the elements.

The invention claimed is:

1. A method of making a flash memory structure, comprising the following steps:
    providing a substrate made of a semiconductive material;
    forming a source on the substrate;
    forming a drain spaced apart from the source on the substrate;
    forming a tunnel isolation layer on the substrate;
    forming a ferroelectric-charge-trapping layer on the tunnel isolation layer, the ferroelectric-charge-trapping layer comprising a charge-trapping layer and a ferroelectric negative-capacitance effect layer;
    forming at least one blocking isolation layer on the ferroelectric-charge-trapping layer; and
    forming at least one gate on the blocking isolation layer;
    wherein the ferroelectric negative-capacitance effect layer is made of a material with the ferroelectric negative-capacitance effect,
    wherein the material with the ferroelectric negative-capacitance effect is selected from the group consisting of hafnium zirconium oxide, hafnium silicon oxide, lead zirconate titanate, barium strontium titanate, strontium bismuth tantalite, lead lanthanum zirconate titanate, hafnium aluminum oxide, hafnium yttrium oxide, or is with hafnium oxide ($HfO_2$) as a matrix and doped with doping materials selected from the group consisting of zirconate (Zr), aluminum (Al), silicon (Si), yttrium (Y), gadolinium (Gd), strontium (Sr), lanthanum (La) and combinations thereof, and
    wherein the material with the ferroelectric negative-capacitance effect comprises zirconium (Zr) of 15-85 mol %, aluminum (Al) of 2-15 mol %, silicon (Si) of 2-10 mol %, yttrium (Y) of 2-15 mol %, gadolinium (Gd) of 2-15 mol %, strontium (Sr) of 2-15 mol %, or lanthanum (La) of 2-15 mol %.

2. The method according to claim 1, wherein the step of providing the substrate comprises forming a columnar tunnel portion, the columnar tunnel portion is formed between the source and the drain, and the tunnel isolation layer is formed on an outside of the columnar tunnel portion and surrounds the columnar tunnel portion.

3. The method according to claim 2, wherein the ferroelectric-charge-trapping layer is formed on an outside of the tunnel isolation layer, the blocking isolation layer is formed on an outside of the ferroelectric-charge-trapping layer, and the at least one gate is formed on an outside of the blocking isolation layer.

4. The method according to claim 3, wherein the tunnel isolation layer surrounds the columnar tunnel portion and is annular, the ferroelectric-charge-trapping layer surrounding the tunnel isolation layer and is annular, and the blocking isolation layer surrounding the ferroelectric-charge-trapping layer and is annular.

5. The method according to claim 4, wherein the at least one gate is plate-shaped, the columnar tunnel portion, the tunnel isolation layer, the ferroelectric-charge-trapping layer and the blocking isolation layer form a columnar structure, the columnar structure extends through the at least one gate in the axial direction of the columnar tunnel portion.

6. The method according to claim 5, wherein the method comprises forming a plurality of the plate-shaped gates, the gates are spaced apart from each other, and the columnar structure extends through the gates in the axial direction of the columnar tunnel portion.

7. The method according to claim 6, wherein the method further comprises forming a plurality of plate-shaped spacing insulation layers, the spacing insulating layers are formed between the gates so that the gates are mutually insulated.

8. The method of claim 2, wherein the method further comprises forming an insulating columnar core, the columnar tunnel portion is formed on an outside of the insulating columnar core and surrounds the insulating column core.

9. The method according to claim 1, wherein the charge-trapping layer and the ferroelectric negative-capacitance effect layer of the ferroelectric-charge-trapping layer are sequentially formed on the tunnel isolation layer, or the ferroelectric negative-capacitance effect layer and the charge-trapping layer of the ferroelectric-charge-trapping layer are sequentially formed on the tunnel isolation layer.

10. The method according to claim 1, wherein the at least one blocking isolation layer is made of a material selected from the group consisting of alumina ($Al_2O_3$) and silicon oxide ($SiO_2$).

11. The method according to claim 1, wherein the charge-trapping layer is made of a conductive material, a semiconductive material, a dielectric material, or a two-dimensional material, wherein the dielectric material is a high dielectric material of zirconium silicon oxide, silicon nitride, tantalum oxide, silicon oxynitride, barium strontium titanate, silicon carbide, silicon oxycarbide, hafnium oxide, hafnium silicon oxide, hafnium zirconium oxide, hafnium silicon oxynitride, hafnium oxynitride, zirconium oxide, titanium oxide, cerium oxide, lanthanum oxide, lanthanum aluminum oxide, or aluminum oxide, the two-dimensional material is graphene, $MoS_2$, $WS_2$, $MoSe_2$, $WSe_2$, SnO, or black phosphorus, and the graphene is porous graphene, monolayer graphene or multilayer graphene.

12. The method according to claim 1, wherein the flash memory structure is used for a nonvolatile flash memory or a ferroelectric memory.

13. The method according to claim 12, wherein the nonvolatile flash memory is a NAND flash memory.

* * * * *